United States Patent
Umetsu et al.

(10) Patent No.: US 9,577,388 B2
(45) Date of Patent: *Feb. 21, 2017

(54) CONNECTOR FOR POWER-SUPPLY UNIT WITH A SIGNAL LINE

(71) Applicant: HITACHI METALS, LTD., Tokyo (JP)

(72) Inventors: Jun Umetsu, Hitachi (JP); Sachio Suzuki, Hitachi (JP); Katsuya Akimoto, Hitachi (JP); Naoki Futakuchi, Hitachinaka (JP); Shinya Hayashi, Hitachi (JP); Takahiro Futatsumori, Mito (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/610,525

(22) Filed: Jan. 30, 2015

(65) Prior Publication Data

US 2015/0233980 A1    Aug. 20, 2015

(30) Foreign Application Priority Data

Feb. 17, 2014 (JP) ................................. 2014-027202

(51) Int. Cl.
*H01R 13/66* (2006.01)
*G01R 33/09* (2006.01)
(Continued)

(52) U.S. Cl.
CPC ......... *H01R 13/6608* (2013.01); *G01R 33/093* (2013.01); *H01R 13/6683* (2013.01);
(Continued)

(58) Field of Classification Search
CPC ..... H01R 13/6683; H01R 13/70; H01R 13/46; H01R 13/6691; G01R 19/0092
(Continued)

(56) References Cited

U.S. PATENT DOCUMENTS 7,626,376 B2    12/2009    Muraki et al.
7,686,630 B2 *   3/2010    Takehara ........... H01R 13/5213
                                                          439/140
(Continued)

FOREIGN PATENT DOCUMENTS

JP    05-028676 A    2/1993
JP    08-180937 A    7/1996
(Continued)

OTHER PUBLICATIONS

USPTO Office Action, U.S. Appl. No. 14/681,453, Feb. 17, 2016, 10 pages.

(Continued)

*Primary Examiner* — Hae Moon Hyeon
(74) *Attorney, Agent, or Firm* — Foley & Lardner LLP

(57) ABSTRACT

A connector for being attached to a power-supply unit including a switching element and for mating with a mating connector of a wire harness, the connector including a connecting terminal including an end portion connected to an output terminal in a casing of the power-supply unit, a housing fixed to the casing and enclosing at least a portion of the connecting terminal, a current sensor enclosed in the housing so as to detect a magnetic field generated by an electric current flowing through the connecting terminal, and a signal line for transmitting an output signal of the current sensor.

5 Claims, 3 Drawing Sheets

(51) Int. Cl.
G01R 15/20 (2006.01)
H01R 105/00 (2006.01)
H01R 13/74 (2006.01)

(52) U.S. Cl.
CPC ........ *G01R 15/207* (2013.01); *H01R 13/6658* (2013.01); *H01R 13/748* (2013.01); *H01R 2105/00* (2013.01); *H01R 2201/26* (2013.01)

(58) Field of Classification Search
USPC .................. 439/620.01, 620.21, 620.22, 292
See application file for complete search history.

(56) References Cited

U.S. PATENT DOCUMENTS

| | | | | |
|---|---|---|---|---|
| 7,824,210 | B2* | 11/2010 | Oka | H01R 13/44 439/372 |
| 2008/0094060 | A1 | 4/2008 | Muraki et al. | |
| 2009/0311899 | A1* | 12/2009 | Takehara | H01R 13/6273 439/292 |
| 2014/0285019 | A1* | 9/2014 | Gelonese | G06F 1/325 307/39 |
| 2015/0233980 | A1* | 8/2015 | Umetsu | G01R 33/093 439/620.22 |

FOREIGN PATENT DOCUMENTS

| | | |
|---|---|---|
| JP | 2941184 B2 | 8/1999 |
| JP | 2956796 B2 | 10/1999 |
| JP | 2008-102116 A | 5/2008 |
| JP | 2010-239811 A | 10/2010 |
| JP | 2012-212679 A | 11/2012 |
| JP | 2013-105714 A | 5/2013 |
| JP | 2014-020980 A | 2/2014 |

OTHER PUBLICATIONS

USPTO Notice of Allowance, U.S. Appl. No. 14/681,453 (US-2005/0063116, US-2011/0187348, US-2012/0091824, US-2012/0126818, US-2012/0302092, US-2013/0015706, US-2013/0015929, US-2013/0040177, US-2013/0045626, US-2013/0106449, US-2013/0147463, US-2013/0154808, US-2013/0162053, US-2013/0252050, US-2013/0313899, US-2013/0314069, US-2013/0317770, US-2015/0102803, US-2015/0137757, US-2015/0204915, US-2015/0204916, US-2015/0204919, US-2015/0233980, US-2015/0289420, US-2015/0295366, US-2015/0316637, U.S. Pat. No. 9,231,353), May 13, 2016.

Japanese Office Action and English translation, Dec. 20, 2016, 6 pages.

* cited by examiner

CONNECTOR FOR POWER-SUPPLY UNIT WITH A SIGNAL LINE

The present application is based on Japanese patent application No. 2014-027202 filed on Feb. 17, 2014, the entire contents of which are incorporated herein by reference.

BACKGROUND OF THE INVENTION

1. Field of the Invention

The invention relates to a connector to be provided on a power-supply unit having switching elements.

2. Description of the Related Art

Some of conventional power-supply units, such as inverter device, having switching elements are provided with a sensor for detecting an output electric current. In an inverter device disclosed in JP-A-2010-239811, plural current sensors are housed in a case of the device and a motor is feedback-controlled according to current values detected by the plural current sensors.

Meanwhile, a connectorized cable has been proposed, which allows a current sensor to be provided separately from an inverter device and thus the inverter device to be downsized. A connectorized cable disclosed in JP-A-2013-105714 has a connector having bus bars to be connected to output terminals of an inverter device, plural cables connected to the inverter device via the connector and plural current sensors for detecting currents flowing through the plural cables, and the plural current sensors are arranged in the connector. Output signals of the current sensors are output to the inverter device via a harness.

Furthermore, one of known connection structures to connect an inverter device to a wire harness is disclosed in JP-A-2012-212679. In the structure disclosed in JP-A-2012-212679, a male connector is provided on the inverter device and a female connector of the wire harness is fitted to the male connector. The mating type connection structure allows the wire harness to be easily attached to or detached from the inverter device.

SUMMARY OF THE INVENTION

The present inventors propose to arrange current sensors in a connector of a connectorized cable as is the structure disclosed in JP-A-2013-105714 while employing the mating type connection structure. However, in this case a problem may arise that a relay connector for relaying output signals of the current sensors needs to be provided in a connector of the inverter device so as to cause an increase in the size of the connector of the inverter device.

It is an object of the invention to provide a connector that allows the downsizing of a power-supply unit while using the mating type connection structure.

(1) According to one embodiment of the invention, a connector for being attached to a power-supply unit comprising a switching element and for mating with a mating connector of a wire harness comprises:

a connecting terminal comprising an end portion connected to an output terminal in a casing of the power-supply unit;

a housing fixed to the casing and enclosing at least a portion of the connecting terminal;

a current sensor enclosed in the housing so as to detect a magnetic field generated by an electric current flowing through the connecting terminal; and a signal line for transmitting an output signal of the current sensor.

Advantageous Effects of the Invention

According to one embodiment of the invention, a connector can be provided that allows the downsizing of a power-supply unit while using the mating type connection structure.

BRIEF DESCRIPTION OF THE DRAWINGS

Next, the present invention will be explained in more detail in conjunction with appended drawings, wherein.

DETAILED DESCRIPTION OF THE PREFERRED EMBODIMENT

Embodiment

Figure 1:
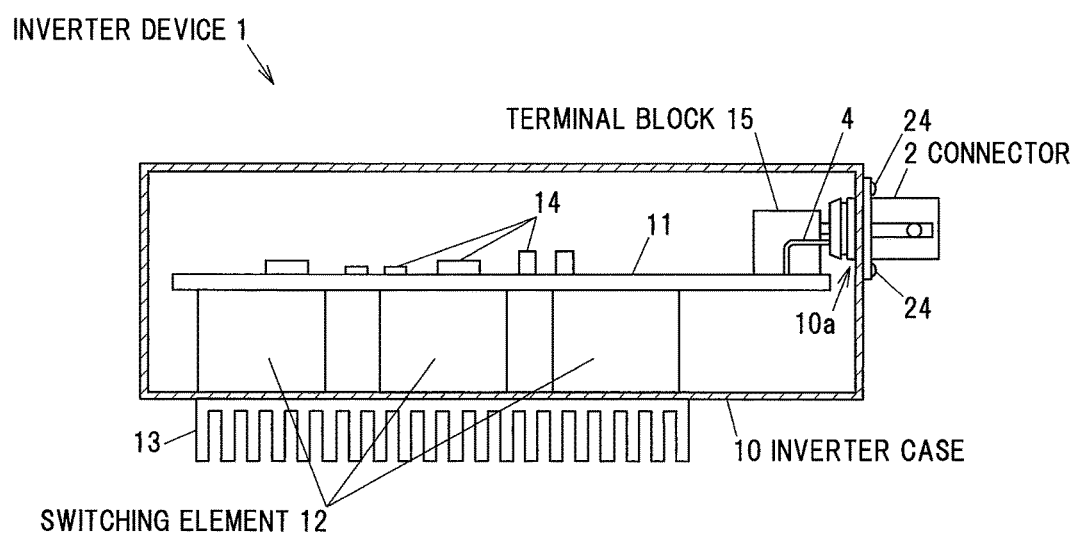
FIG. 1 is a cross sectional view showing an inverter device provided with a connector in an embodiment of the present invention.

FIG. 1 is a cross sectional view showing an inverter device as a power-supply unit provided with a connector in the embodiment of the invention. An inverter device 1 is mounted on, e.g., a vehicle to convert DC voltage output from a rechargeable battery into AC voltage by PWM (Pulse Width Modulation) and to output the AC voltage to a three-phase AC motor which is a drive source for driving the vehicle.

The inverter device 1 has an inverter case 10 as a casing, a circuit board 11 fixed to the inverter case 10, plural switching elements 12 fixed to the circuit board 11, a heat-radiating fin 13 for cooling the switching elements 12, plural circuit components 14 for switching on and off of the switching elements 12, a terminal block 15 and a connector 2. The circuit board 11, the plural switching elements 12, the circuit components 14 and the terminal block 15 are housed in the inverter case 10. A portion of the connector 2 is housed in the inverter case 10 and the remaining portion is exposed from the inverter case 10.

The inverter case 10 is formed of, e.g., a conductive metal such as aluminum alloy. In FIG. 1, a portion of the inverter case 10 is cut to show the inside thereof. The heat-radiating fin 13 is arranged at a position at which the bottom of the inverter case 10 is sandwiched between itself and the plural switching elements 12.

The switching elements 12 are, e.g., power transistors and each phase (U-phase, V-phase and W-phase) has two switching elements 12. In other words, in the present embodiment, six switching elements 12 are fixed to the circuit board 11. Three of the six switching elements 12 are shown in FIG. 1.

The plural circuit components 14 include a logic circuit element for performing PWM by switching on/off of the switching elements 12, an amplifying element and a passive element such as resistor or capacitor, etc., and are mounted on a mounting surface of the circuit board 11 on the opposite side to the plural switching elements 12.

The terminal block 15 is arranged at an end portion of the circuit board 11 on the mounting surface side. The terminal block 15 has plural output terminals (described later) each output a phase current.

The connector 2 is partially inserted into an opening 10a formed on the inverter case 10 and is removably provided on the inverter case 10. The connector 2 has plural connecting terminals which correspond to output terminals for multi-phase currents output from the inverter device 1.

In addition, the connector 2 has plural current sensors corresponding to the multi-phase currents output from the inverter device 1, and output signals of the plural current sensors are transmitted to the circuit board 11 through a signal line 4. The output signals are used for feedback-control of the three-phase AC motor.

Figure 2:
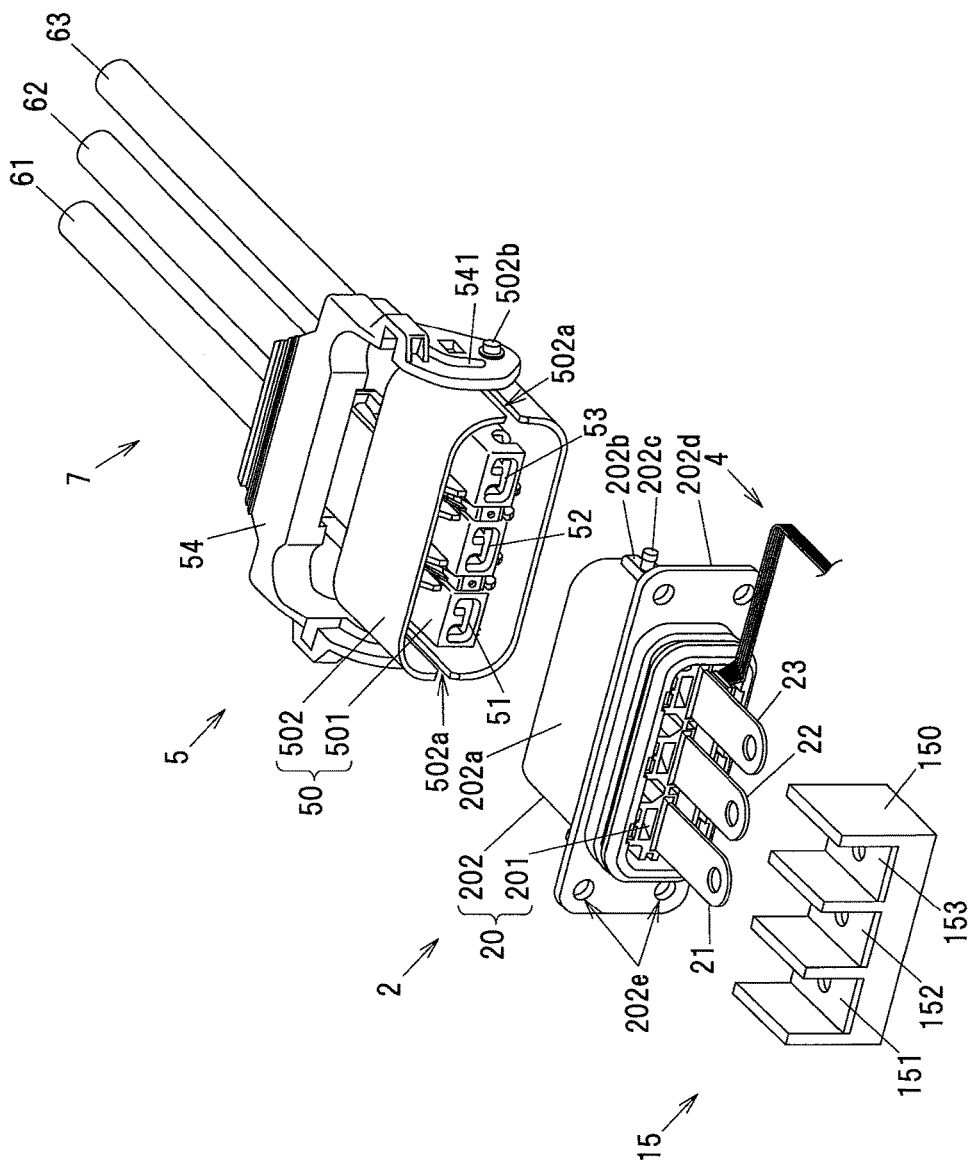
FIG. 2 is a perspective view showing a terminal block, the connector and one end of a wire harness having a mating connector to mate with the connector.
Figure 3:
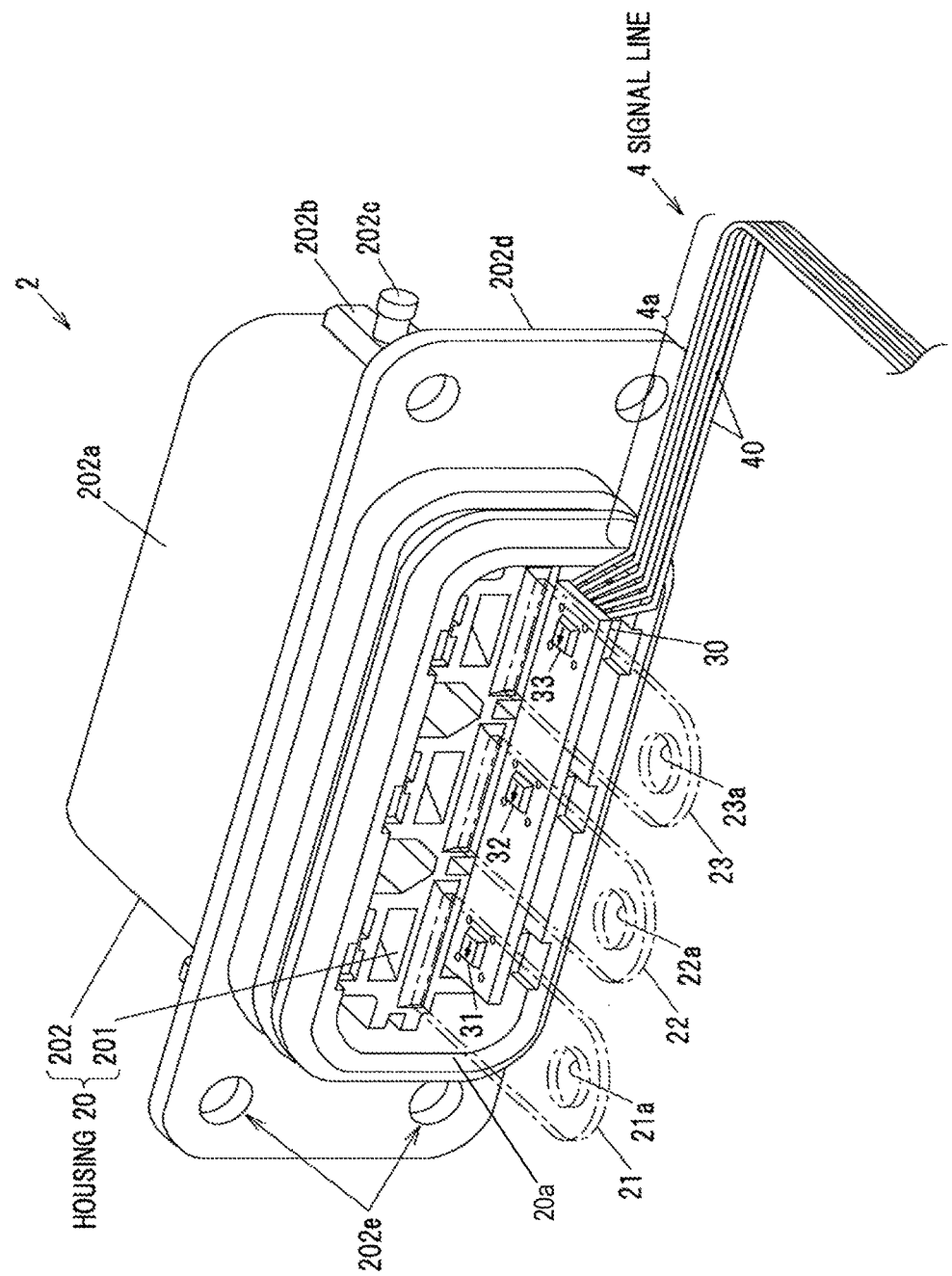
FIG. 3 is a perspective view showing an enlarged part of the connector in FIG. 2.

FIG. 2 is a perspective view showing the terminal block 15, the connector 2 and one end of a wire harness 7 having a mating connector 5 to mate with the connector 2. FIG. 3 is a perspective view showing an enlarged part of the connector 2 in FIG. 2. In FIG. 3, first to third connecting terminals 21 to 23 of the connector 2 are indicated by a phantom line (dash-dot line) and a portion on the far side is indicated by a solid line.

The terminal block 15 has a main body 150 formed of a resin and first to third output terminals 151 to 153. The first output terminal 151 is an output terminal for U-phase current, the second output terminal 152 is an output terminal for V-phase current, and the third output terminal 153 is an output terminal for W-phase current.

The connector 2 is provided with the first to third connecting terminals 21 to 23 of which one end portions are connected to the first to third output terminals 151 to 153 of the terminal block 15 housed in the inverter case 10, a housing 20 at least partially housing the first to third connecting terminals 21 to 23, first to third current sensors 31 to 33 which are housed in the housing 20 and detect magnetic fields generated by currents flowing through the first to third connecting terminals 21 to 23, a substrate 30 mounting the first to third current sensors 31 to 33, and the signal line 4 for transmitting output signals of the first to third current sensors 31 to 33.

The first to third connecting terminals 21 to 23 of the connector 2 are arranged in parallel in a predetermined alignment direction so as to correspond to the first to third output terminals 151 to 153. In the present embodiment, one end portions of the first to third connecting terminals 21 to 23 are exposed from the housing 20 and the exposed portions are respectively connected to the first to third output terminals 151 to 153 of the terminal block 15. The first to third connecting terminals 21 to 23 have a plate shape at an end portion to be connected to the first to third output terminals 151 to 153 of the terminal block 15 and respectively have insertion holes 21a, 22a and 23a at a tip portion to insert bolts (not shown) used for fixing to the terminal block 15.

The first connecting terminal 21 of the connector 2 is fixed to the terminal block 15 by a bolt (not shown) so as to be in contact with the first output terminal 151. Likewise, the second and third connecting terminals 22 and 23 are fixed to the terminal block 15 by bolts (not shown) so as to be respectively in contact with the second and third output terminals 152 and 153.

The housing 20 of the connector 2 is composed of an inner housing 201 formed of a resin and an outer housing 202 formed of a conductive metal such as aluminum alloy. The inner housing 201 is housed in the outer housing 202. The first to third connecting terminals 21 to 23 are held by the inner housing 201.

Also, the first to third connecting terminals 21 to 23 are arranged in parallel in a predetermined alignment direction such that the second connecting terminal 22 is located between the first connecting terminal 21 and the third connecting terminal 23. The one end portions of the first to third connecting terminals 21 to 23 are parallel to each other.

The outer housing 202 has a cylindrical main body 202a, a pair of protruding strips 202b (only one of the protruding strips 202b is shown in FIG. 2) formed on the outer surface of the main body 202a, protrusions 202c provided at longitudinal end portions of the protruding strips 202b, and a plate-like flange 202d formed to extend outward from the main body 202a. The pair of protruding strips 202b are formed on the outer housing 202 at both ends in the alignment direction of the first to third connecting terminals 21 to 23. Each protrusion 202c is formed at an end portion of the protruding strip 202b on the opposite side to the flange 202d. The flange 202d has a rectangular plate shape with bolt insertion holes 202e formed at the four corners. The connector 2 is removably fixed to the inverter case 10 by bolts 24 (shown in FIG. 1) inserted into the bolt insertion holes 202e.

The first to third current sensors 31 to 33 are GMR (Giant Magneto Resistive effect) sensors having a giant magnetoresistive element. The giant magnetoresistive element uses a giant magnetoresistive effect which allows a significant change in the electrical resistance to be obtained with a small change in the magnetic field. In more detail, whereas a magnetoresistive effect of, e.g., a Hall element provides about several percent of the rate of change in the electrical resistance, the giant magnetoresistive element using the giant magnetoresistive effect can obtain about several tens percent of the rate of change in the electrical resistance. In addition, the giant magnetoresistive element has characteristics of detecting the strength of the magnetic field in a direction along a predetermined detection axis but not detecting a magnetic field in a direction orthogonal to the detection axis. In FIG. 3, the detection axis is indicated on the first to third current sensors 31 to 33 by arrows.

The first current sensor 31 is arranged in the vicinity of the first connecting terminal 21 to detect the strength of the magnetic field generated by the U-phase current. The second current sensor 32 is arranged in the vicinity of the second connecting terminal 22 to detect the strength of the magnetic field generated by the V-phase current. Also, the third current sensor 33 is arranged in the vicinity of the third connecting terminal 23 to detect the strength of the magnetic field generated by the W-phase current.

The detection axis of the first current sensor 31 is along a direction of the magnetic field generated by the U-phase current flowing through the first connecting terminal 21. The detection axis of the second current sensor 32 is along a direction of the magnetic field generated by the V-phase current flowing through the second connecting terminal 22. In addition, the detection axis of the third current sensor 33 is along a direction of the magnetic field generated by the W-phase current flowing through the third connecting terminal 23.

The first to third current sensors 31 to 33 are mounted on the substrate 30 which is held by the housing 20. In the present embodiment, the substrate 30 is held by the inner housing 201. In addition, the first to third current sensors 31 to 33 are arranged in the housing 20 on the inner side of an open end 20a of the housing 20. Thus, the first to third current sensors 31 to 33 are entirely housed in the housing 20.

The signal line 4 for transmitting the output signals of the first to third current sensors 31 to 33 is composed of plural (six in the present embodiment) insulated wires 40 which are routed by a guide member (not shown). A lead-out portion 4a of the signal line 4, which is a portion led out of the housing 20, extends out in a direction orthogonal to an extending direction of the one end portions of the first to third connecting terminals 21 to 23. This extending direction coincides with the direction of each phase current flowing through the first to third connecting terminals 21 to 23. The length of the lead-out portion 4a (the length of the signal line 4 at a portion led out of the housing 20 and extending in the direction orthogonal to the extending direction of the one end portions of the first to third connecting terminals 21 to 23) is desirably not less than 1.0 mm, more desirably, not less than 5.0 mm.

In the present embodiment, the signal line 4 extends out also along the predetermined alignment direction of the first to third connecting terminals 21 to 23. In other words, the lead-out portion 4a of the signal line 4 extends in parallel to the predetermined alignment direction.

The signal line 4 does not need to extend from the edge of the substrate 30 and may alternatively extend from the middle portion of the substrate 30. In addition, the lead-out portion 4a does not need to be provided when, e.g., the strength of the magnetic fields generated by the currents flowing through the first to third connecting terminals 21 to 23 does not affect the output signals transmitted through the signal line 4. In other words, the signal line 4 may extend along the extending direction of the first to third connecting terminals 21 to 23.

Other end portions of the first to third connecting terminals 21 to 23 come into contact with first to third connecting terminals 51 to 53 of the mating connector 5 when the connector 2 is fitted to the mating connector 5. The mating connector 5 has a housing 50, the first to third connecting terminals 51 to 53 and a pivot lever 54. The housing 50 is composed of an inner housing 501 formed of a resin and an outer housing 502 formed of a conductive metal such as aluminum alloy. The inner housing 501 is housed in the outer housing 502. The first to third connecting terminals 51 to 53 are held by the inner housing 501.

On the outer housing 502, a pair of sliding grooves 502a for inserting the protruding strips 202b of the connector 2 are formed at both end portions in an alignment direction of the first to third connecting terminals 51 to 53. In addition, protrusions 502b to be a rotary shaft of the pivot lever 54 are formed on the outer housing 502. Curved grooves 541 curved in an arc shape are formed on the pivot lever 54. Rotational movement of the pivot lever 54 around the protrusions 502b pulls the protrusions 202c of the connector 2 along the curved grooves 541 into the back of the sliding grooves 502a, thereby securely fitting the connector 2 to the mating connector 5.

One end portion of a U-phase wire 61 is connected to the first connecting terminal 51. One end portion of a V-phase wire 62 is connected to the second connecting terminal 52. In addition, one end portion of a W-phase wire 63 is connected to the third connecting terminal 53. Other end portions of the U-phase wire 61, the V-phase wire 62 and the W-phase wire 63 are electrically connected respectively to U-, V- and W-phase windings of the three-phase AC motor via a connector (not shown).

The inverter device 1 configured as described above supplies U-, V- and W-phase currents to the three-phase AC motor through the wire harness 7 connected to the connector 2. The first to third current sensors 31 to 33 detect the magnetic fields generated by the U-, V- and W-phase currents and send the output signals to the circuit components 14 in the inverter case 10 through the signal line 4.

Functions And Effects Of The Embodiment

The following functions and effects are obtained in the embodiment.

(1) The first to third current sensors 31 to 33 are arranged in the connector 2 and the output signals of the first to third current sensors 31 to 33 are transmitted through the signal line 4. Therefore, it is possible to suppress an increase in the size of the connector 2 as compared to the case where current sensors for detecting a magnetic field generated by each phase current are provided on, e.g., the mating connector 5. That is, when the current sensors are arranged in the mating connector 5, the output signals of the current sensors need to be brought into the inverter case 10 via the connector 2 and it is thus necessary to additionally provide a member such as a relay connector in the connector 2. In contrast, in the present embodiment, it is not necessary to add such a member and it is thus possible to suppress an increase in the size of the connector 2.

(2) Arranging the first to third current sensors 31 to 33 in the housing 20 of the connector 2 allows the first to third current sensors 31 to 33 to be placed farther from the plural switching elements 12 as a noise source than the case where the current sensors for detecting a magnetic field generated by each phase current are mounted on, e.g., the circuit board 11. This suppresses an influence of electromagnetic wave generated by the plural switching elements 12 and allows detection accuracy of the first to third current sensors 31 to 33 to be increased. In addition, since it is not necessary to arrange plural current censors on the circuit board 11, it is possible to downsize the circuit board 11, leading to a decrease in the size of the inverter device 1.

(3) Since the signal line 4 is arranged so that the lead-out portion 4a led out of the housing 20 extends out in the direction orthogonal to the extending direction of the one end portions of the first to third connecting terminals 21 to 23, noise superimposed on signals (the output signals of the first to third current sensors 31 to 33) propagating through the signal line 4 by the magnetic fields generated by the currents flowing through the first to third connecting terminals 21 to 23 can be suppressed. In other words, if the signal line 4 is led out of the housing 20 so as to be parallel to the extending direction of the one end portions of the first to third connecting terminals 21 to 23, a section in which a distance between the signal line 4 and the first to third connecting terminals 21 to 23 is short becomes long and the signals propagating through the signal line 4 are prone to be affected by the magnetic fields generated by the currents flowing through the first to third connecting terminals 21 to 23. In contrast, in the present embodiment, it is possible to reduce such an influence of the magnetic fields. Particularly, in the present embodiment, the signal line 4 extends out along the predetermined alignment direction of the first to third connecting terminals 21 to 23. Therefore, the influence of the magnetic fields generated by the currents flowing through the first to third connecting terminals 21 to 23 on the signals propagating through the signal line 4 can be reduced as much as possible.

(4) The first to third current sensors 31 to 33 are GMR sensors having a giant magnetoresistive element and thus can highly accurately detect the magnetic fields generated by the currents flowing through the first to third connecting terminals 21 to 23.

(5) The first to third current sensors 31 to 33 are mounted on the substrate 30 which is held by the housing 20. Therefore, it is possible to easily fix the first to third current sensors 31 to 33 at appropriate positions suitable for detecting the magnetic fields. In addition, it is possible to transmit the output signals of the first to third current sensors 31 to 33 through the signal line 4 only by connecting core centers of the insulated wires 40 to electrodes formed on the substrate 30 by soldering, etc. Therefore, connection of the signal line 4 is easy.

(6) Since the connector 2 is removable from the inverter case 10, it is possible to easily replace a component at the time of failure of the current sensor. That is, in case that the current sensors are provided on the mating connector 5, the entire wire harness 7 needs to be replaced at the time of failure of the current sensor. In contrast, in the present embodiment, it is necessary to replace only the connector 2 when any of the first to third current sensors 31 to 33 fails. This facilitates replacement work when any of the first to third current sensors 31 to 33 fails.

Summary of the Embodiment

Technical ideas understood from the embodiment will be described below citing the reference numerals, etc., used for the embodiment. However, each reference numeral described below is not intended to limit the constituent elements in the claims to the members, etc., specifically described in the embodiment.

[1] A connector (2) for being attached to a power-supply unit (e.g., the inverter device 1) comprising switching elements (12) and for mating with a mating connector (5) of a wire harness (7), the connector (2) comprising: connecting terminals (21 to 23) connected at one end portions to output terminals (151 to 153) in a casing (the inverter case 10) of the power-supply unit (the inverter device 1); a housing (20) that is fixed to the casing (the inverter case 10) and houses at least a portion of the connecting terminals (21 to 23); current sensors (31 to 33) that are housed in the housing (20) and detect magnetic fields generated by electric currents flowing through the connecting terminals (21 to 23); and a signal line (4) for transmitting output signals of the current sensors (31 to 33).

[2] The connector (2) as defined in [1], wherein a portion of the signal line (4) led out of the housing (20) extends out in a direction orthogonal to an extending direction of the one end portions of the connecting terminals (21 to 23).

[3] The connector (2) as defined in [2], wherein a plurality of the connecting terminals (21 to 23) are arranged in parallel in a predetermined alignment direction so as to correspond to a plurality of output terminals (151 to 153) each for a phase current output from the power-supply unit (the inverter device 1), and the signal line (4) extends out in the alignment direction.

[4] The connector (2) as defined in any one of [1] to [3], wherein the current sensors (31 to 33) are GMR sensors having a giant magnetoresistive element, and a detection axis of the giant magnetoresistive element is along a direction of magnetic fields generated by the electric currents flowing through the connecting terminals (21 to 23).

[5] The connector (2) as defined in any one of the [1] to [4], wherein a plurality of the current sensors (31 to 33) are arranged respectively to detect magnetic fields generated by multi-phase currents output from the power-supply unit (the inverter device 1), and are mounted on a substrate (30) held by the housing (20).

Although the embodiment of the invention has been described, the invention according to claims is not to be limited to the embodiment. Further, all combinations of the features described in the embodiment are not necessary to solve the problem of the invention.

In addition, the invention can be appropriately modified and implemented without departing from the gist thereof. For example, although the connector 2 used for the inverter device 1 has been described in the embodiment, it is not limited thereto. The connector 2 is applicable to various power-supply units, such as converter system, having switching elements.

In addition, although the first to third connecting terminals 21 to 23 partially housed in the connector 2 have been described in the embodiment, it is not limited thereto. The first to third connecting terminals 21 to 23 may be entirely housed in the housing 20. In other words, it is only necessary that at least a portion of the first to third connecting terminals 21 to 23 is housed in the housing 20.

In addition, although the signal line 4 extending out along the predetermined alignment direction of the first to third connecting terminals 21 to 23 has been described in the embodiment, it is not limited thereto. It is possible to obtain a certain effect as long as the signal line 4 led out of the housing 20 extends out in the direction orthogonal to the extending direction of the one end portions of the first to third connecting terminals 21 to 23.

In addition, although the first to third current sensors 31 to 33 as GMR sensors have been described in the embodiment, it is not limited thereto. For example, hall ICs may be used as the first to third current sensors 31 to 33.

What is claimed is:

1. A connector for being attached to a power-supply unit comprising a switching element and for mating with a mating connector of a wire harness, the connector comprising:
   a connecting terminal comprising an end portion connected to an output terminal in a casing of the power-supply unit;
   a housing fixed to the casing and enclosing at least another end portion of the connecting terminal;
   a current sensor for detecting a magnetic field generated by an electric current flowing through the connecting terminal; and
   a signal line for transmitting an output signal of the current sensor,
   wherein the current sensor is mounted on a substrate held by the housing in a vicinity of the connecting terminal such that the current sensor is enclosed by the housing.

2. The connector according to claim 1, wherein the signal line comprises a portion led out of the housing that extends out in a direction orthogonal to an extending direction of the end portion of the connecting terminal.

3. The connector according to claim 2, wherein the connecting terminal further comprises a plurality of connecting terminals arranged in parallel in a predetermined alignment direction corresponding to a plurality of output terminals each for a phase current output from the power-supply unit, and
   wherein the signal line extends out along the predetermined alignment direction.

4. The connector according to claim 1, wherein the current sensor comprises a GMR sensor comprising a giant magnetoresistive element, and
   the giant magnetoresistive element comprises a detection axis along a direction of the magnetic field generated by the electric current flowing through the connecting terminal.

5. The connector according to claim 1, wherein the current sensor comprises a plurality of current sensors that are each arranged to detect a magnetic field generated by a multi-phase current output from the power-supply unit, and are mounted on the substrate held by the housing.

* * * * *